(12) United States Patent
Chu

(10) Patent No.: US 9,435,836 B2
(45) Date of Patent: Sep. 6, 2016

(54) POWER CONSUMPTION DETECTOR AND MOTHERBOARD AS WELL AS FAN BOARD USING THE SAME

(71) Applicants: Inventec (Pudong) Technology Corporation, Shanghai (CN); INVENTEC CORPORATION, Taipei (TW)

(72) Inventor: Fang-Jie Chu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 846 days.

(21) Appl. No.: 13/836,010

(22) Filed: Mar. 15, 2013

(65) Prior Publication Data

US 2014/0122002 A1    May 1, 2014

(30) Foreign Application Priority Data

Oct. 25, 2012   (CN) .......................... 2012 1 0414113

(51) Int. Cl.
   *G01R 21/00*     (2006.01)
   *G01R 21/133*    (2006.01)
   *G06F 11/30*     (2006.01)
   *G06F 1/32*      (2006.01)

(52) U.S. Cl.
   CPC ......... *G01R 21/133* (2013.01); *G06F 11/3062* (2013.01); *G06F 11/3089* (2013.01); *G06F 1/3206* (2013.01)

(58) Field of Classification Search
   CPC ............ G01R 21/133; G06F 11/3062; G06F 11/3089; G06F 1/3206
   USPC ............................................. 702/61; 713/300
   See application file for complete search history.

(56) References Cited

U.S. PATENT DOCUMENTS

| | | | |
|---|---|---|---|
| 4,360,879 A * | 11/1982 | Cameron | G01R 21/133 324/116 |
| 2010/0241876 A1* | 9/2010 | Sun | G06F 1/28 713/300 |

* cited by examiner

*Primary Examiner* — Gregory J Toatley
*Assistant Examiner* — Yoshihisa Ishizuka
(74) *Attorney, Agent, or Firm* — Maschoff Brennan

(57) ABSTRACT

A power consumption detector includes a first resistor, an amplification unit, a voltage divider and a processing unit. A first end of the first resistor, coupled to the object, receives a current from the object during working. An amplification unit has a first input end coupled to a second end of the first resistor and a second input end receiving the working voltage. The amplification has an output end generating an amplification signal. A voltage divider, coupled to the output end of the amplification unit, is used for receiving the amplification signal and generating a voltage division signal. A processing unit, coupled to the voltage divider, is used for receiving the voltage division signal, calculating the current flowing through the first resistor and power consumption of the object upon the current and the working voltage. The power consumption detector is applied to a motherboard or a fan board.

15 Claims, 2 Drawing Sheets

POWER CONSUMPTION DETECTOR AND MOTHERBOARD AS WELL AS FAN BOARD USING THE SAME

CROSS-REFERENCE TO RELATED APPLICATIONS

This non-provisional application claims priority under 35 U.S.C. §119(a) on Patent Application No(s). 201210414113.7 filed in China, P.R.C. on Oct. 25, 2012, the entire contents of which are hereby incorporated by reference.

BACKGROUND

1. Technical Field

The disclosure relates to a power consumption detector, and more particularly to a power consumption detector capable of improving precision of power consumption detection, and a motherboard as well as a fan board using the same.

2. Related Art

For current server systems, the power consumption of each module in a server system needs to be detected additionally, to acquire the working status of each module. The power consumption detection may be performed on the entire server system, or performed on a single module such as a motherboard, a fan board, or a hard disk. It is worth noting that resource allocation in the server system is more secure and reasonable through evaluating the power consumption of each module than evaluating the power consumption of the entire server system.

Generally speaking, the server system reads an Inter-Integrated Circuit (I2C) bus of a Power Supply Unit (PSU) to calculate the power consumption of each module in the server system, so as to proceed to subsequent related operations. However, when the server system is running under high loading, the precision of the detected power consumption of each module is acceptable, but one hundred percent precision cannot be reached yet. In some cases, the detection error even reaches 15%. Therefore, the power consumption detection on the modules in the server system needs further improvement.

SUMMARY

A power consumption detector is configured to detect power consumption of an object to be detected, wherein the object to be detected generates a working voltage during working. More specifically, the power consumption detector comprises a first resistor, an amplification unit, a voltage divider and a processing unit. The first resistor has a first end and a second end. The first end of the first resistor is coupled to the object to be detected and the first resistor receives a current generated by the object to be detected during working. An amplification unit has a first input end, a second input end and an output end. The first end of the amplification is coupled to a second end of the first resistor and the second input end is configured to receive the working voltage. The output end of the amplification is configured to generate an amplification signal. A voltage divider, coupled to the output end of the amplification unit, is configured to receive the amplification signal and perform voltage division on the amplification signal to generate a voltage division signal. A processing unit, coupled to the voltage divider, is configured to receive the voltage division signal and calculate a current that flows through the first resistor according to a level of the voltage division signal. Moreover, the processing unit is configured to calculate power consumption of the object to be detected according to the current and the working voltage.

Moreover, a motherboard comprises a power consumption detector. The power consumption detector is configured to detect power consumption of an object to be detected, wherein the object to be detected generates a working voltage during working. More specifically, the power consumption detector comprises a first resistor, an amplification unit, a voltage divider and a processing unit. The first resistor has a first end and a second end. The first end of the first resistor is coupled to the object to be detected and the first resistor receives a current generated by the object to be detected during working. An amplification unit has a first input end, a second input end and an output end. The first end of the amplification is coupled to a second end of the first resistor and the second input end is configured to receive the working voltage. The output end of the amplification is configured to generate an amplification signal. A voltage divider, coupled to the output end of the amplification unit, is configured to receive the amplification signal and perform voltage division on the amplification signal to generate a voltage division signal. A processing unit, coupled to the voltage divider, is configured to receive the voltage division signal and calculate a current that flows through the first resistor according to a level of the voltage division signal. Moreover, the processing unit is configured to calculate power consumption of the object to be detected according to the current and the working voltage.

Furthermore, a fan board comprises a power consumption detector. The power consumption detector is configured to detect power consumption of an object to be detected, wherein the object to be detected generates a working voltage during working. More specifically, the power consumption detector comprises a first resistor, an amplification unit, a voltage divider and a processing unit. The first resistor has a first end and a second end. The first end of the first resistor is coupled to the object to be detected and the first resistor receives a current generated by the object to be detected during working. An amplification unit has a first input end, a second input end and an output end. The first end of the amplification is coupled to a second end of the first resistor and the second input end is configured to receive the working voltage. The output end of the amplification is configured to generate an amplification signal. A voltage divider, coupled to the output end of the amplification unit, is configured to receive the amplification signal and perform voltage division on the amplification signal to generate a voltage division signal. A processing unit, coupled to the voltage divider, is configured to receive the voltage division signal and calculate a current that flows through the first resistor according to a level of the voltage division signal. Moreover, the processing unit is configured to calculate power consumption of the object to be detected according to the current and the working voltage.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
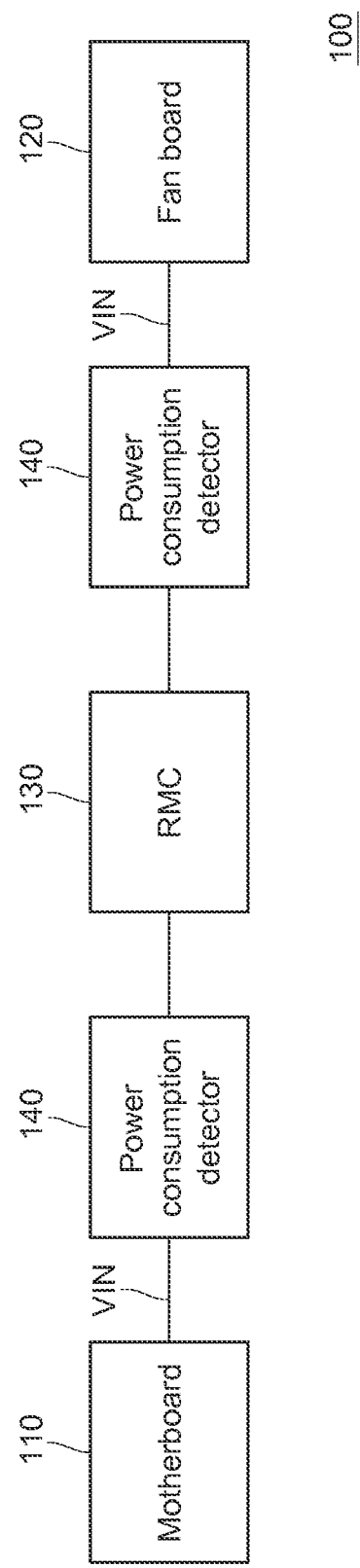
FIG. 1 is a block diagram of a server system according to the disclosure.

FIG. 1 is a block diagram of a server system according to the disclosure. In this embodiment, a server system 100 is a container server. The server system 100 comprises a motherboard 110, a fan board 120, a Rack Management Controller (RMC) 130 and a power consumption detector 140 according to the disclosure.

The motherboard 110 is provided with a power consumption detector 140 to detect power consumption of the motherboard. The fan board is also provided with another power consumption detector 140 to detect power consumption of the fan board. Once the motherboard 110 and the fan board 120 start working, a working voltage VIN generated by the motherboard 110 and the fan board 120 are output to the power consumption detectors 140 connected thereto, so that the power consumption detectors 140 detect the power consumptions of the motherboard 110 and the fan board 120, thereby calculating power consumption values corresponding to the working voltages VIN, and storing the power consumption values.

After the power consumption detectors 140 calculate the power consumption values of the motherboard 110 and the fan board 120, the RMC 130 reads the power consumption values stored by the power consumption detectors 140 to obtain the working status and the corresponding power consumption values of the motherboard 110 and the fan board 120. This process may proceed to subsequent related operations, such as reducing power of the motherboard 110 or reducing the rotating speed of a fan through the fan board 120.

The embodiment shown in FIG. 1 uses the one motherboard 110 and the one fan board 120 as an example, but the disclosure is not limited thereto. Users may adjust the number of the motherboards 110 and the fan boards 120 according to requirements, and the number of the power consumption detectors 140 also changes along with the number of the motherboards 110 and fan boards 120. Each motherboard 110 or fan board 120 is connected to the one power consumption detector 140 for power consumption detection.

In addition, in this embodiment, the power consumption detector 140 being used for detecting the power consumption of the motherboard 110 or the fan board 120 is exemplary, and the disclosure is not limited thereto. In other embodiments, the power consumption detector 140 may detect power consumption of other components in the server system 100.

Moreover, in one embodiment, the power consumption detectors 140 are respectively disposed on the motherboard 110 and the fan board 120 in a detachable manner, and are coupled to the motherboard 110 and the fan board 120 through a connection port, a bus or other means. In other embodiments, the power consumption detectors 140 are directly disposed on the motherboard 110 and the fan board 120.

The internal circuit structure and corresponding operations of the power consumption detector 140 according to the disclosure are further described below. Moreover, in order to facilitate the description, an object to be detected 250 is used to represent the motherboard 110 or the fan board 120.

Figure 2:
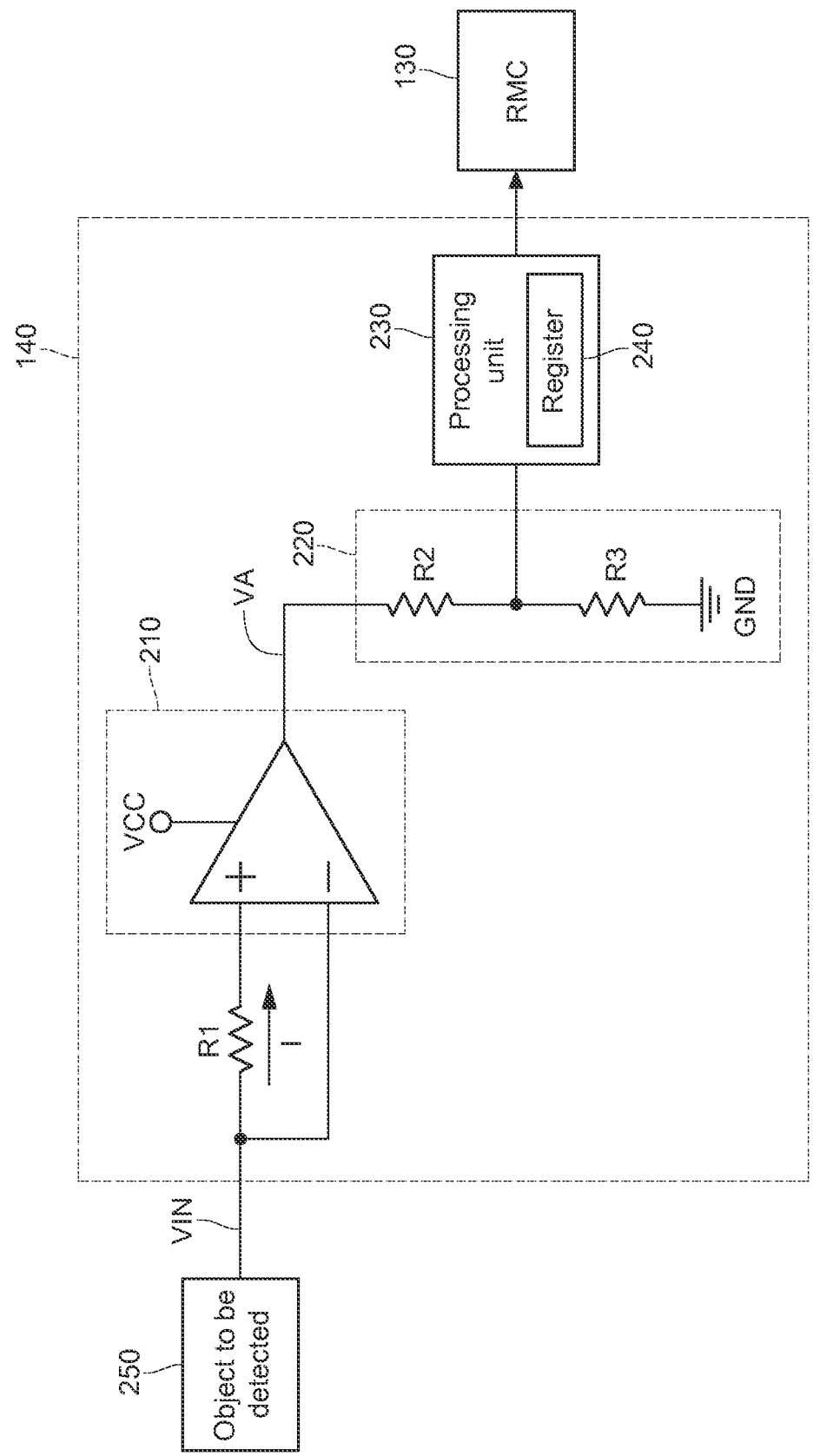
FIG. 2 is a detailed block diagram of a power consumption detector according to the disclosure.

Referring to FIG. 2, it is a detailed block diagram of the power consumption detector 140 according to the disclosure. In this embodiment, the object to be detected 250 (namely the motherboard 110 or the fan board 120) generates a working voltage VIN during working. The power consumption detector 140 comprises a first resistor R1, an amplification unit 210, a voltage divider 220 and a processing unit 230.

A first end of the first resistor R1 is configured to be coupled to the object to be detected 250 (namely, the motherboard 110 or the fan board 120). For example, the first end of the first resistor R1 is coupled to a pin or a contact of the object to be detected 250 and configured to receive a current I generated by the object to be detected 250 during working. Thereby, the current I flows through the first resistor R1. In this embodiment, the first resistor R1 may be a precision resistor.

A first input end (e.g. a positive input end) of the amplification unit 210 is coupled to a second end of the first resistor R1. A second input end (e.g. a negative input end) of the amplification unit 210 is coupled to the first end of the first resistor R1 and configured to receive the working voltage VIN generated by the object to be detected 250. An output end of the amplification unit 210 generates an amplification signal VA.

In this embodiment, the amplification unit 210 may be an Operation Amplifier (OPA). Moreover, in this embodiment, a voltage value of the amplification signal VA output by the amplification unit 210 may be smaller than that of a working voltage VCC of the amplification unit 210, so as to improve the precision of power consumption detection.

The voltage divider 220, coupled to the amplification unit 210, is configured to receive the amplification signal VA and perform voltage division on the amplification signal VA to generate a voltage division signal VD. Furthermore, the voltage divider 220 comprises a second resistor R2 and a third resistor R3. A first end of the second resistor R2 is coupled to the output end of the amplification unit 210 and is configured to receive the amplification signal VA. A second end of the second resistor R2 generates the voltage division signal VD. A first end of the third resistor R3 is coupled to the second end of the second resistor R2, and a second end of the third resistor R3 is coupled to a ground end GND.

The processing unit 230, coupled to the voltage divider 220, is configured to receive the voltage division signal VD. The processing unit then is configured to calculate the current I that flows through the first resistor R1 according to a voltage level of the voltage division signal VD and calculate power consumption of the object to be detected 250 according to the current I and the working voltage VIN. Furthermore, the processing unit 230 comprises a register 240 configured to store the power consumption of the object to be detected 250. The RMC 130 is configured to read the power consumption of the object to be detected 250 stored by the register 240, so as to proceed to subsequent related operations.

In this embodiment, a valid input voltage range of the processing unit 230 is limited. Therefore, it is ensured that the voltage division signal VD, generated through voltage division performed by the voltage divider 220 on the amplification signal VA, falls within the valid voltage input range of the processing unit 230, thereby facilitating the subsequent processing.

In addition, in order to detect the change of the current I precisely, the amplification unit 230 requires a great amplification coefficient K, so that a voltage drop on the first resistor R1 can be presented explicitly after being amplified by the amplification unit 230 (that is, the small voltage drop between the two ends of the first resistor R1 is multiplied by a great amplification coefficient K), thereby facilitating the subsequent power consumption calculation. Therefore, in this embodiment, the amplification signal VA is not adjusted by adjusting the value of the amplification coefficient K of the amplification unit 230, thereby improving the precision of the power consumption detection.

First, when working, the object to be detected 250 generates a working voltage VIN as well as outputting the working voltage VIN to the first end of the first resistor R1 and the second input end (negative input end) of the amplification unit 210. A current I then flows through the first resistor R1, and the first resistor R1 generates a voltage drop so that the value of a voltage received by the first input end (positive input end) of the amplification unit 210 is equal to the working voltage VIN minus the voltage drop on the first resistor R1 (that is, VIN−I*R1).

Then, the amplification unit 210 calculates a voltage difference between the voltages received by the first input end and the second input end (namely the voltage drop I*R1 on the first resistor R1). According to the amplification coefficient K, the amplification unit 210 generates an amplification signal VA through multiplying the voltage difference (the voltage drop on the first resistor) by the amplification coefficient K. The voltage divider 220 then performs voltage division on the amplification signal VA through the second resistor R2 and the third resistor R3 so as to generate a voltage division signal VD.

Subsequently, the processing unit 230 receives the voltage division signal VD, and calculates the current I flowing through the first resistor R1 according to the voltage level of the voltage division signal VD, Formula (1) and Formula (2). Formula (1) and Formula (2) are respectively expressed as follows:

$$VD=(I*R1*K*R3)/(R2+R3) \qquad (1)$$

$$I=VD*(R2+R3)/(R1*K*R3) \qquad (2)$$

The processing unit 230 further calculates the power consumption of the object to be detected according to the current I and the working voltage VIN. That is, the power consumption is equal to the working voltage VIN multiplied by the current I (VIN*I). Moreover, the processing unit 230 stores the power consumption of the object to be detected 250 in the register 240 to record the power consumption corresponding to the object to be detected 250.

Hence, the power consumption detector 140 according to the disclosure detects the power consumption of the object to be detected 250 (namely the motherboard 110 or the fan board 120). In addition, the voltage value of the amplification signal VA output by the amplification unit 210 is set to be smaller than that of the working voltage VCC of the amplification unit 210, which reduces the error of the power consumption detection to 3%, thereby effectively improving the precision of the power consumption detection.

In the power consumption detector, and the motherboard as well as the fan board using the same according to the disclosure, the first resistor generates a voltage drop, so that a voltage difference is generated between the two input ends of the amplification unit. The voltage difference is amplified by the amplification unit and then is performed voltage division. Subsequently, the processing unit calculates the power consumption of the object to be detected according to the current that flows through the first resistor and the working voltage generated by the object to be detected. Hence, the circuit structure is simplified and the precision of the power consumption detection is improved.

What is claimed is:

1. A power consumption detector for detecting power consumption of an object to be detected, the object to be detected generating a working voltage during working, the power consumption detector comprising:
   a first resistor having a first end and a second end, wherein the first end is coupled to the object to be detected and configured to receive a current generated by the object to be detected during working;
   an amplification unit having a first input end, a second input end and an output end, the first input end coupled to a second end of the first resistor, the second input end configured to receive the working voltage, and the output end configured to generate an amplification signal;
   a voltage divider coupled to the output end of the amplification unit, and the voltage divider configured to receive the amplification signal and perform voltage division on the amplification signal to generate a voltage division signal; and
   a processing unit coupled to the voltage divider, and the processing unit configured to receive the voltage division signal, calculate the current flowing through the first resistor according to a level of the voltage division signal, and calculate a power consumption of the object to be detected according to the current and the working voltage.

2. The power consumption detector according to claim 1, wherein the voltage divider comprises:
   a second resistor having a first end and a second end, the first end coupled to the output end of the amplification unit and configured to receive the amplification signal, and the second end configured to output the voltage division signal; and
   a third resistor having a first end and a second end, the first end coupled to the second end of the second resistor, and the second end coupled to a ground end.

3. The power consumption detector according to claim 1, wherein the amplification unit is an Operation Amplifier (OPA).

4. The power consumption detector according to claim 1, wherein a voltage value of the amplification signal output by the amplification unit is smaller than a voltage value of the working voltage of the amplification unit.

5. The power consumption detector according to claim 1, wherein the processing unit comprises a register configured to store the power consumption of the object to be detected.

6. A motherboard, comprising a power consumption detector for detecting power consumption of an object to be detected, the object to be detected generating a working voltage during working, the power consumption detector comprising:
   a first resistor having a first end and a second end, wherein the first end is coupled to the object to be detected and configured to receive a current generated by the object to be detected during working;
   an amplification unit having a first input end, a second input end and an output end, the first input end coupled to a second end of the first resistor, the second input end configured to receive the working voltage, and the output end configured to generate an amplification signal;
   a voltage divider coupled to the output end of the amplification unit, and the voltage divider configured to receive the amplification signal and perform voltage division on the amplification signal to generate a voltage division signal; and a processing unit coupled to the voltage divider, and the processing unit configured to receive the voltage division signal, calculate the current flowing through the first resistor according to a level of the voltage division signal, and calculate a power consumption of the object to be detected according to the current and the working voltage.

7. The motherboard according to claim 6, wherein the voltage divider comprises:
   a second resistor having a first end and a second end, the first end coupled to the output end of the amplification unit and configured to receive the amplification signal, and the second end configured to output the voltage division signal; and
   a third resistor having a first end and a second end, the first end coupled to the second end of the second resistor, and the second end coupled to a ground end.

8. The motherboard according to claim 6, wherein the amplification unit is an Operation Amplifier (OPA).

9. The motherboard according to claim 6, wherein a voltage value of the amplification signal output by the amplification unit is smaller than a voltage value of the working voltage of the amplification unit.

10. The motherboard according to claim 6, wherein the processing unit comprises a register configured to store the power consumption of the object to be detected.

11. A fan board, comprising a power consumption detector for detecting power consumption of an object to be detected, the object to be detected generating a working voltage during working, the power consumption detector comprising:
   a first resistor having a first end and a second end, wherein the first end is coupled to the object to be detected and configured to receive a current generated by the object to be detected during working;
   an amplification unit having a first input end, a second input end and an output end, the first input end coupled to a second end of the first resistor, the second input end configured to receive the working voltage, and the output end configured to generate an amplification signal;
   a voltage divider coupled to the output end of the amplification unit, and the voltage divider configured to receive the amplification signal and perform voltage division on the amplification signal to generate a voltage division signal; and
   a processing unit coupled to the voltage divider, and the processing unit configured to receive the voltage division signal, calculate the current flowing through the first resistor according to a level of the voltage division signal, and calculate a power consumption of the object to be detected according to the current and the working voltage.

12. The fan board according to claim 11, wherein the voltage divider comprises:
   a second resistor having a first end and a second end, the first end coupled to the output end of the amplification unit and configured to receive the amplification signal, and the second end configured to output the voltage division signal; and
   a third resistor having a first end and a second end, the first end coupled to the second end of the second resistor, and the second end coupled to a ground end.

13. The fan board according to claim 11, wherein the amplification unit is an Operation Amplifier (OPA).

14. The fan board according to claim 11, wherein a voltage value of the amplification signal output by the amplification unit is smaller than a voltage value of the working voltage of the amplification unit.

15. The fan board according to claim 11, wherein the processing unit comprises a register configured to store the power consumption of the object to be detected.

* * * * *